United States Patent
Kosakai et al.

(10) Patent No.: US 10,923,381 B2
(45) Date of Patent: Feb. 16, 2021

(54) ELECTROSTATIC CHUCK DEVICE

(71) Applicant: SUMITOMO OSAKA CEMENT CO., LTD., Tokyo (JP)

(72) Inventors: Mamoru Kosakai, Tokyo (JP); Yukio Miura, Tokyo (JP); Kazunori Ishimura, Tokyo (JP); Keisuke Maeda, Tokyo (JP); Hitoshi Kouno, Tokyo (JP); Yuuki Kinpara, Tokyo (JP); Shinichi Maeta, Tokyo (JP); Tomomi Ito, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 295 days.

(21) Appl. No.: 16/070,478

(22) PCT Filed: Jan. 18, 2017

(86) PCT No.: PCT/JP2017/001507
§ 371 (c)(1),
(2) Date: Jul. 16, 2018

(87) PCT Pub. No.: WO2017/126534
PCT Pub. Date: Jul. 27, 2017

(65) Prior Publication Data
US 2019/0019714 A1    Jan. 17, 2019

(30) Foreign Application Priority Data

Jan. 19, 2016   (JP) .............................. JP2016-007861
Jan. 19, 2016   (JP) .............................. JP2016-007862

(51) Int. Cl.
*H01L 21/683*   (2006.01)
*H01L 21/687*   (2006.01)
(Continued)

(52) U.S. Cl.
CPC .... *H01L 21/6833* (2013.01); *H01L 21/67103* (2013.01); *H01L 21/67109* (2013.01);
(Continued)

(58) Field of Classification Search
CPC ......... H01L 21/67103; H01L 21/67109; H01L 21/67126; H01L 21/67132;
(Continued)

(56) References Cited

U.S. PATENT DOCUMENTS

2011/0164955 A1*   7/2011   White ............... H01L 21/68742
                                                          414/800
2014/0159325 A1*   6/2014   Parkhe .............. H01J 37/32715
                                                          279/128
2014/0376148 A1   12/2014   Sasaki et al.

FOREIGN PATENT DOCUMENTS

JP       04-147643 A      5/1992
JP       2004-031665 A    1/2004
(Continued)

OTHER PUBLICATIONS

Machine translation of Kunioka et al. Japanese Patent Document JP H04-147643 A May 21, 1992 (Year: 1992).*
(Continued)

*Primary Examiner* — Kevin J Comber
(74) *Attorney, Agent, or Firm* — Merchant & Gould P.C.

(57) ABSTRACT

An electrostatic chuck device includes: an electrostatic chuck part which incorporates an internal electrode for electrostatic attraction and has a placing surface on which a plate-like sample is placed; a base part which cools the electrostatic chuck part; and an adhesion layer which bonds the electrostatic chuck part and the base part to integrate the parts together, in which a first through-hole is provided in the electrostatic chuck part, a second through-hole that communicates with the first through-hole is provided in the
(Continued)

base part, a tubular insulator is fixed in the second through-hole, an annular sealing member is sandwiched between the electrostatic chuck part and a distal end surface of the insulator, wherein the distal end surface is located on the electrostatic chuck part side of the insulator, and a tubular insulating wall member is located at the inner side of the sealing member in the radial direction.

17 Claims, 10 Drawing Sheets

(51) Int. Cl.
  *H01L 21/67* (2006.01)
  *H02N 13/00* (2006.01)
(52) U.S. Cl.
  CPC .. *H01L 21/67126* (2013.01); *H01L 21/67132* (2013.01); *H01L 21/67248* (2013.01); *H01L 21/6875* (2013.01); *H01L 21/68757* (2013.01); *H01L 21/68785* (2013.01); *H02N 13/00* (2013.01)

(58) Field of Classification Search
  CPC ........... H01L 21/67248; H01L 21/6833; H01L 21/6875; H01L 21/68757; H01L 21/68785; H02N 13/00
  USPC ......................................................... 361/234
  See application file for complete search history.

(56) References Cited

FOREIGN PATENT DOCUMENTS

| | | |
|---|---|---|
| JP | 2008-270721 A | 11/2008 |
| WO | 2013/118781 A1 | 8/2013 |

OTHER PUBLICATIONS

International Search Report for PCT/JP2017/001507 (dated Apr. 11, 2017).

* cited by examiner

ELECTROSTATIC CHUCK DEVICE

TECHNICAL FIELD

The present invention relates to an electrostatic chuck device.

This application is a U.S. National Stage Application under 35 U.S.C. § 371 of International Patent Application No. PCT/JP2017/001507 filed on Jan. 18, 2017, which claims the benefit of priority to Japanese Patent Application No. 2016-007861 filed on Jan. 19, 2016 and Japanese Patent Application No. 2016-007862 filed on Jan. 19, 2016, the disclosures of all of which are hereby incorporated by reference in their entireties. The International Application was published in Japanese on Jul. 27, 2017 as WO 2017/126534.

BACKGROUND

In the past, in a semiconductor manufacturing apparatus, an electrostatic chuck device for fixing a plate-like sample such as a wafer or a glass substrate to a chucking surface has been used. The electrostatic chuck device is provided with an electrostatic chuck part having an electrostatic attraction mechanism, a base part for cooling the electrostatic chuck part, and an adhesion layer for bonding the electrostatic chuck part and the base part together. In such an electrostatic chuck device, through-holes are provided in order to separate the plate-like sample from the chucking surface or to introduce a cooling gas. In each of these through-holes, an insulating sleeve is disposed in order to enhance withstand voltage of the electrostatic chuck device (for example, Patent Literature No.

CITATION LIST

Patent Literature

[Patent Literature No. 1] Japanese Laid-open Patent Publication No. 2004-31665

SUMMARY OF INVENTION

Technical Problem

In the electrostatic chuck device of the related art, there is a concern that plasma may infiltrate from a through-hole for gas flow and a through-hole for insertion of a pin for separating the plate-like sample from the chucking surface, thereby eroding the adhesion layer. The adhesion layer has a function of fixing the electrostatic chuck part and the base part to each other in a state where insulation is secured and uniformly performing heat conduction between the electrostatic chuck part and the cooling base part. For this reason, the erosion of the adhesion layer around the through-hole by plasma lowers withstand voltage, thereby shortening the life of the electrostatic chuck device, and also causes a temperature change around the through-hole over time.

The present invention has been made in view of such circumstances and has an object to provide a highly reliable electrostatic chuck device in which it is possible to realize longer life by suppressing erosion of an adhesion layer by plasma.

Solution to Problem

The present invention provides an electrostatic chuck device including: an electrostatic chuck part having a placing surface on which a plate-like sample is placed, and a built-in internal electrode for electrostatic attraction; a base part which cools the electrostatic chuck part; and an adhesion layer which bonds and integrates the electrostatic chuck part and the base part together, in which a first through-hole is provided in the electrostatic chuck part, a second through-hole that communicates with the first through-hole is provided in the base part, a tubular insulator is fixed into the second through-hole, an annular sealing member is sandwiched between a distal end surface of the insulator, which is located on the electrostatic chuck part side, and the electrostatic chuck part, and the electrostatic chuck device further has at least one of the following (a) to (c).

(a) A tubular insulating wall member is located radially inside the sealing member.

(b) A counterbore is provided in an opening of the second through-hole, which is located on the electrostatic chuck part side, and an insulating ring that surrounds an end portion of the insulator, which is located on the electrostatic chuck part side, from the outside in a radial direction, is fixed to an inner peripheral surface of the counterbore.

(c) An inner diameter side of the distal end surface of the insulator, which is located on the electrostatic chuck part side, is higher than an outer diameter side of the distal end surface.

That is, an electrostatic chuck device according to a first aspect of the present invention is an electrostatic chuck device including: an electrostatic chuck part which incorporates an internal electrode for electrostatic attraction and has a placing surface on which a plate-like sample is placed; a base part which cools the electrostatic chuck part; and an adhesion layer which bonds the electrostatic chuck part and the base part to integrate the parts together, in which a first through-hole is provided in the electrostatic chuck part, a second through-hole that communicates with the first through-hole is provided in the base part, a tubular insulator is fixed into the second through-hole, an annular sealing member is sandwiched between the electrostatic chuck part and a distal end surface of the insulator, wherein the distal end surface is located on the electrostatic chuck part side of the insulator, and a tubular insulating wall member is located at the inner side of the sealing member in the radial direction.

The electrostatic chuck device of the first aspect preferably has the following features. These features may be used in combination with each other.

The insulating wall member is integrally formed on the distal end surface of the insulator.

The insulating wall member is a separate member from the insulator, and at least a part of the insulating wall member is located at the inner side of the insulator in the radial direction. In this case, the insulating wall member and the insulator may be made of materials having different corrosion resistance, thermal conductivity, electric resistance, and insulation resistance.

A tubular outer insulating wall member is further located outside of the sealing member in the radial direction.

The height of the insulating wall member is smaller than the thickness of the sealing member before it is sandwiched.

The insulating wall member is in contact with the electrostatic chuck part at an end surface of the member on the electrostatic chuck part side.

A counterbore is provided at an opening of the second through-hole, wherein the opening is located on the electrostatic chuck part side, an insulating ring is fixed to an inner peripheral surface of the counterbore, and the insulating ring surrounds, from the outside in a radial direction, an end portion of the insulator which is located on the electrostatic chuck part side.

The insulator has a fixing part by which the insulator is detachably fixed to the base part.

The electrostatic chuck device further includes a heater, which is located at any one of an interior of the electrostatic chuck part, an interior of the base part, and a position between the electrostatic chuck part and the base part.

An electrostatic chuck device according to a second aspect of the present invention is an electrostatic chuck device including: an electrostatic chuck part which incorporates an internal electrode for electrostatic attraction and has a placing surface on which a plate-like sample is placed; a base part which cools the electrostatic chuck part; and an adhesion layer which bonds the electrostatic chuck part and the base part together to integrate the parts together, in which a first through-hole is provided in the electrostatic chuck part, a second through-hole that communicates with the first through-hole is provided in the base part, a tubular insulator is fixed into the second through-hole, an annular sealing member is sandwiched between the electrostatic chuck part and a distal end surface of the insulator, wherein the distal end surface is located on the electrostatic chuck part side of the insulator, a counterbore is provided at an opening of the second through-hole, wherein the opening is located on the electrostatic chuck part side, and an insulating ring is fixed to an inner peripheral surface of the counterbore, wherein the insulating ring surrounds, from the outside in a radial direction, an end portion of the insulator which is located on the electrostatic chuck part side.

The electrostatic chuck device of the second aspect preferably has the following features. These features may be used in combination with each other.

The insulator has a fixing part by which the insulator is detachably fixed to the base part.

The electrostatic chuck device further includes a heater which is located at any one of an interior of the electrostatic chuck part, an interior of the base part, and a space between the electrostatic chuck part and the base part.

The distal end surface of the insulator, which is located on the electrostatic chuck part side of the insulator, has an inner diameter side and an outer diameter side wherein the inner diameter side is higher than the outer diameter side.

Further, an electrostatic chuck device according to a third aspect of the present invention is an electrostatic chuck device including: an electrostatic chuck part which incorporates an internal electrode for electrostatic attraction and has a placing surface on which a plate-like sample is placed; a base part which cools the electrostatic chuck part; and an adhesion layer which bonds the electrostatic chuck part and the base part to integrate the parts together, in which a first through-hole is provided in the electrostatic chuck part, a second through-hole that communicates with the first through-hole is provided in the base part, a tubular insulator is fixed into the second through-hole, an annular sealing member is sandwiched between the electrostatic chuck part and a distal end surface of the insulator, wherein the distal end surface is located on the electrostatic chuck part side of the insulator, and the distal end surface of the insulator, which is located on the electrostatic chuck part side, has an inner diameter side and an outer diameter side wherein the inner diameter side is higher than the outer diameter side.

Advantageous Effects of Invention

According to the present invention, it is possible to provide a highly reliable electrostatic chuck device in which it is possible to realize longer life by suppressing erosion of an adhesion layer by plasma.

DESCRIPTION OF EMBODIMENTS

Figure 1:
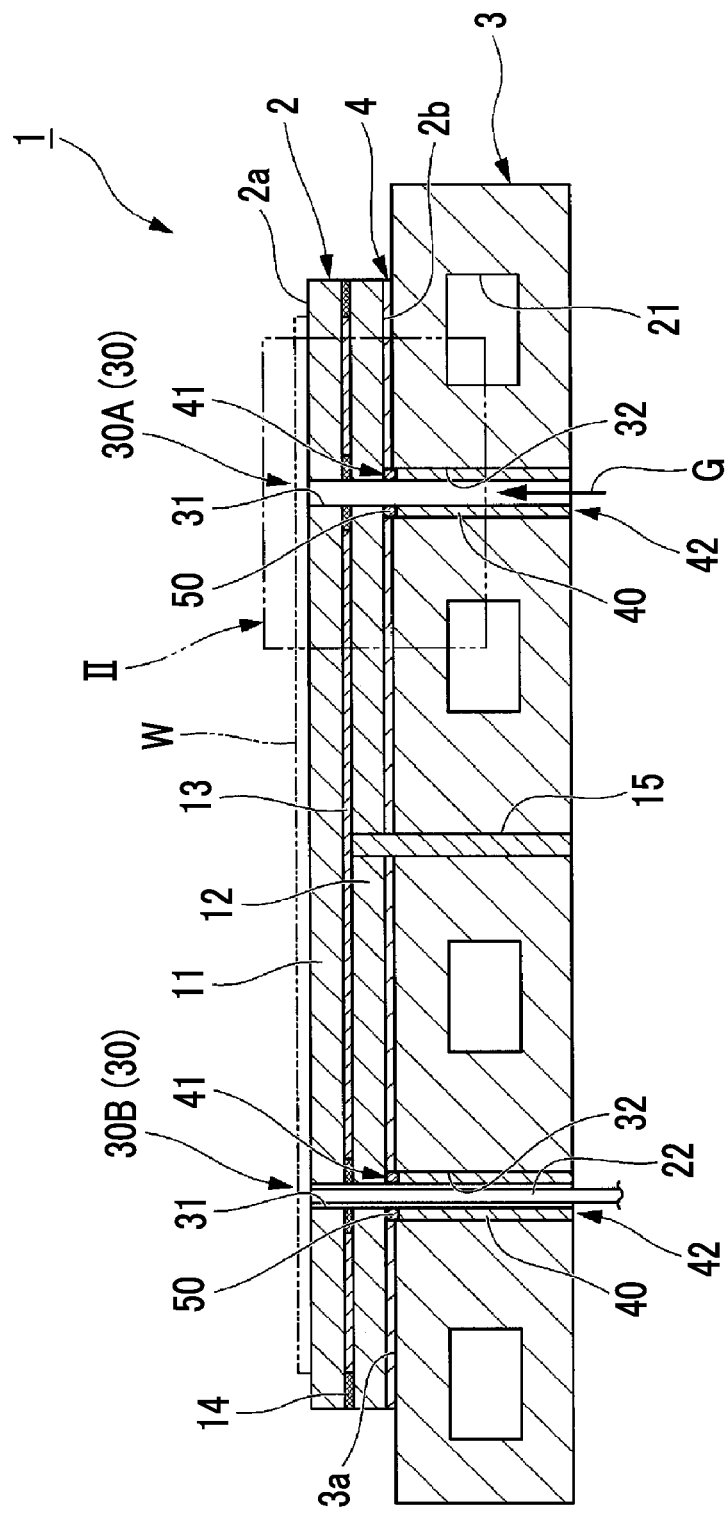
FIG. 1 is a sectional view of an electrostatic chuck device of a first embodiment.

Hereinafter, Embodiments 1 to 5 which are preferred examples of the present invention will be described with reference to the drawings. In the drawings which are used in the following description, in order to make the features easy to understand, there is a case where characteristic portions are shown in an enlarged manner for convenience, and the dimensional ratio or the like of each constituent element is not necessarily the same as the actual value.

Further, the following examples are examples which are specifically described for the purpose of better understanding of the gist of the invention, and do not limit the present invention unless otherwise specified. Changes, omissions, or additions of the number, a position, a size, a numerical value, or the like can be made within a scope which does not depart from the gist of the present invention. Further, mutual features or preferable examples of first, second, and third aspects can be combined with each other unless there is any particular problem.

Electrostatic Chuck Device of First Aspect

First Embodiment

Figure 2:
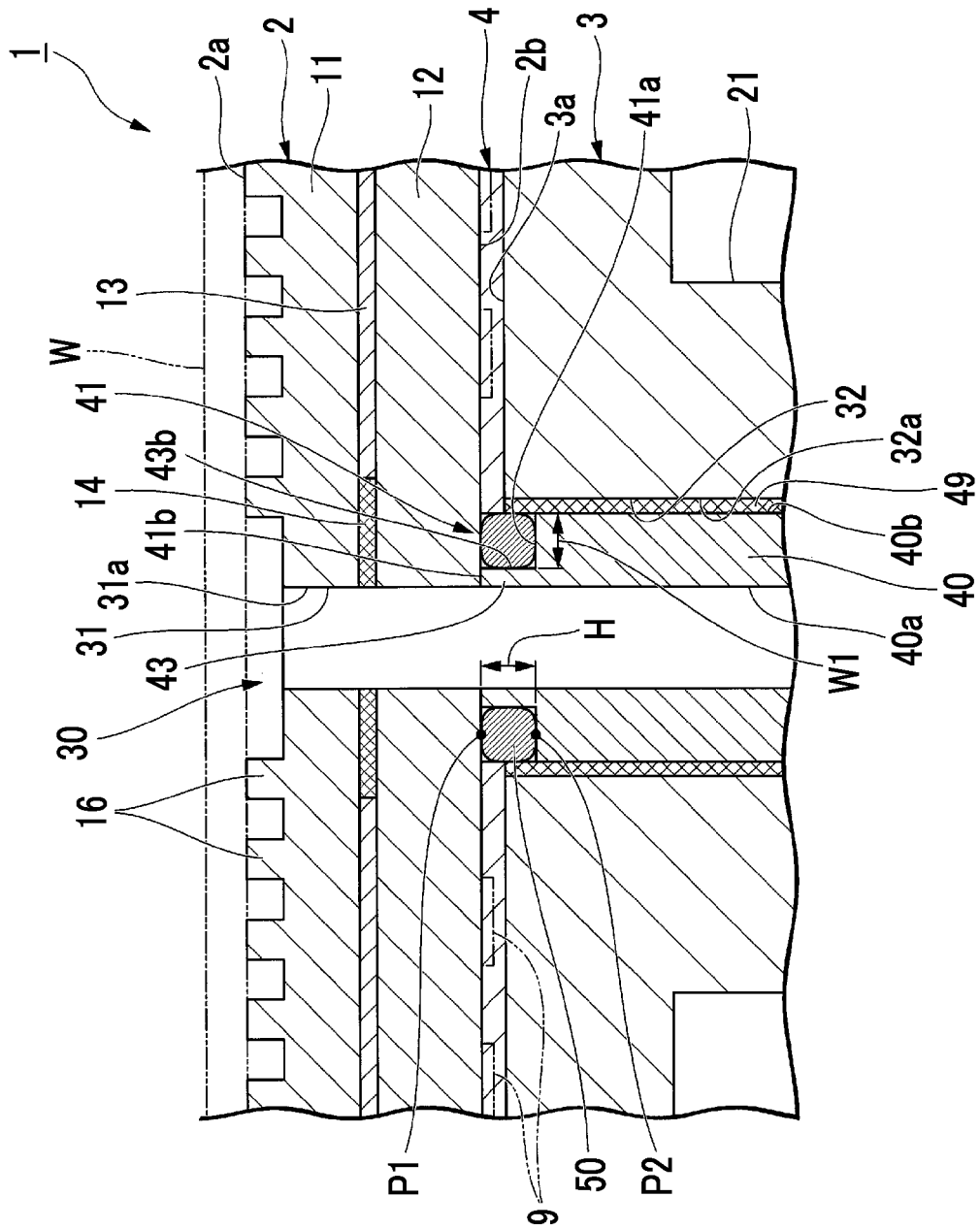
FIG. 2 is an enlarged view of a region II shown in FIG. 1.

FIG. 1 is a sectional view of an electrostatic chuck device 1 of a first embodiment. Further, FIG. 2 is an enlarged view of a region II shown in FIG. 1. The electrostatic chuck device 1 includes: an electrostatic chuck part 2 having a placing surface 2a on which a plate-like sample W is placed, and a built-in internal electrode for electrostatic attraction 13; a base part 3 which cools the electrostatic chuck part 2 from below; and an adhesion layer 4 which bonds and integrates the electrostatic chuck part 2 and the base part 3 together.

In this specification, the relative positions of the respective configurations will be described with the placing surface 2a side being the upper side of the electrostatic chuck device 1 and the base part 3 side being the lower side of the electrostatic chuck device 1. However, the posture of the electrostatic chuck device 1 in use is not limited to this direction.

(Electrostatic Chuck Part)

The electrostatic chuck part 2 has a structure in which a placing plate 11, the internal electrode for electrostatic attraction 13, an insulating material layer 14 that surrounds a peripheral edge portion of the internal electrode 13, and a supporting plate 12 are stacked in order from the upper side. Further, the electrostatic chuck part 2 has a power supply terminal 15 penetrating the adhesion layer 4 and the base part 3 and applying voltage to the internal electrode for electrostatic attraction 13.

The electrostatic chuck part 2 has the circular placing plate 11 having an upper surface serving as the placing surface 2a on which the plate-like sample W such as a semiconductor wafer is placed, and the circular supporting plate 12 disposed to face the lower surface side of the placing plate 11. The electrostatic chuck part 2 further has the circular internal electrode for electrostatic attraction 13 clamped between the placing plate 11 and the supporting plate 12 and having a smaller diameter than the placing plate 11 and the supporting plate 12, and the power supply terminal 15 connected to the lower surface of the internal electrode 13 to apply a direct-current voltage thereto.

Each of the placing plate 11 and the supporting plate 12 is preferably made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, an yttrium oxide ($Y_2O_3$) sintered compact, or the like.

In particular, the placing plate 11 has the placing surface 2a on the upper side thereof, and therefore, it is preferable that the placing plate 11 is made of a material which has particularly a high dielectric constant and does not becomes an impurity with respect to the plate-like sample W to be electrostatically attracted thereto, that is, is not determined to be an impurity. From such a viewpoint, it is preferable that a silicon carbide-aluminum oxide compound sintered compact containing silicon carbide in an amount of 4% by mass or more and 20% by mass or less and aluminum oxide as the balance is adopted as the constituent material of the placing plate 11.

As shown in FIG. 2, a plurality of projection portions 16 each having a diameter smaller than the thickness of the plate-like sample Ware formed on the placing surface 2a of the placing plate 11. The projection portions 16 support the plate-like sample W.

The placing plate 11 has the placing surface 2a on the upper side thereof and is made of a material which has particularly a high dielectric constant and does not become an impurity with respect to the plate-like sample W to be electrostatically attracted thereto.

The internal electrode for electrostatic attraction 13 is located on the lower side of the placing plate 11. The internal electrode 13 is used as an electrostatically chucking electrode for generating electric charges and fixing the plate-like sample W with an electrostatic attraction force. The shape or size of the internal electrode 13 can be appropriately adjusted according to the use thereof. For example, the internal electrode for electrostatic attraction 13 can be provided as an electrode having a predetermined pattern in a layer where the internal electrode 13 is formed. The internal electrode for electrostatic attraction 13 may be provided as a so-called solid electrode having no pattern and functions favorably.

The internal electrode for electrostatic attraction 13 can be formed by any method. For example, the internal electrode can be formed by forming metal foil on the supporting plate 12 by sputtering or vapor deposition. In addition, the internal electrode for electrostatic attraction 13 can be formed by applying a composite material of a conductive material, which is a material for forming the internal electrode for electrostatic attraction 13, and an organic substance, by a coating method such as screen printing.

The internal electrode for electrostatic attraction 13 can be formed of a material which is selected in a predetermined manner. For example, it can be formed of conductive ceramics such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo). Further, the internal electrode for electrostatic attraction 13 can also be formed of copper (Cu), aluminum (Al), and/or carbon (C). The thickness of the internal electrode for electrostatic attraction 13 can be selected in a predetermined manner and is not particularly limited. However, the thickness is preferably 0.1 μm or more and 50 μm or less.

The insulating material layer 14 is a layer for bonding and integrating the placing plate 11 and the supporting plate 12 together and protecting the internal electrode for electrostatic attraction 13 from plasma.

A material configuring the insulating material layer 14 can be selected in a predetermined manner, and, for example, an insulating material having the same main component as the placing plate 11 and the supporting plate 12 is preferable. For example, in a case where the placing plate 11 and the supporting plate 12 are made of a silicon carbide-aluminum oxide compound sintered compact, it is preferable that the material is aluminum oxide ($Al_2O_3$).

The power supply terminal 15 is a rod-shaped terminal provided to apply a direct-current voltage to the internal electrode for electrostatic attraction 13. As a material for forming the power supply terminal 15, as long as it is a conductive material having excellent heat resistance, the material can be selected in a predetermined manner and is not particularly limited. A metal material or a conductive organic material can be preferably selected and used. The power supply terminal 15 is insulated from the base part 3.

(Base Part)

The base part 3 is provided on the lower side of the electrostatic chuck part 2 and controls the temperature of the electrostatic chuck part 2 to a desired temperature. Further, the base part 3 also functions as a high frequency generating electrode. A flow path 21 for circulating a cooling medium such as water or an organic solvent is formed in the interior of the base part 3. With this configuration, the electrostatic chuck part 2 is cooled, and the temperature of the plate-like sample W placed on the placing surface 2a is maintained at a desired temperature. The base part 3 is preferably made of aluminum (Al) or an aluminum alloy. It is preferable that at least the surface of the base part 3, which is exposed to plasma, is subjected to alumite treatment or has an insulating film such as alumina formed thereon. With such a structure, in addition to improvement in plasma resistance, abnormal discharge is prevented, and therefore, a configuration is made in which plasma resistance stability is improved. Further, it becomes difficult for scratches to be formed on the surface, and thus it is possible to prevent the occurrence of scratches. The material of the base part 3 is not limited as long as it is a metal material having good thermal conductivity. For example, copper (Cu), a copper alloy, and/or stainless steel (SUS) or the like may be adopted.

(Adhesion Layer)

The adhesion layer 4 is interposed between a lower surface 2b of the electrostatic chuck part 2 and an upper surface 3a of the base part 3. The adhesion layer 4 bonds and integrates the electrostatic chuck part 2 and the base part 3 together. The adhesion layer 4 can be formed of a material which is selected in a predetermined manner. However, it is preferable that it is formed of an adhesive having heat resistance in a temperature range of −20° C. to 150° C. As the adhesion layer, for example, acrylic resin, silicone resin, epoxy resin, or the like is suitable. In particular, in a case of using oxygen-based plasma, it is preferable to use silicone resin having excellent plasma resistance against the oxygen-based plasma.

The shape of the adhesion layer 4 can be selected in a predetermined manner. For example, it may be a cured film obtained by curing a sheet-shaped or film-shaped adhesive having an arbitrary shape, which is cured by heating a coating film obtained by applying a liquid thermosetting adhesive, by a method such as thermal compression bonding.

(Cooling Gas Introduction Hole and Pin Insertion Hole)

In the electrostatic chuck part 2, the base part 3, and the adhesion layer 4, a plurality of cooling gas introduction holes 30A and a plurality of pin insertion holes 30B are provided to vertically penetrating them. The cooling gas introduction holes 30A are provided to supply cooling gas G such as helium (He) toward the plate-like sample W placed on the electrostatic chuck part 2. Further, a lift pin 22 for assisting separation of the plate-like sample W attracted to the placing surface 2a is inserted into each of the pin insertion holes 30B. A drive unit (not shown) is connected to lower ends of the lift pins 22 and vertically drives the lift pins 22 along penetration directions of the pin insertion holes 30B.

The cooling gas introduction hole 30A and the pin insertion hole 30B have the same configuration. In the following description, the cooling gas introduction hole 30A and the pin insertion hole 30B are collectively referred to simply as a through-hole 30.

The through-hole 30 has a first through-hole 31 which is a portion penetrating the electrostatic chuck part 2, and a second through-hole 32 which is a portion penetrating the base part 3. That is, the first through-hole 31 is provided in the electrostatic chuck part 2, the second through-hole 32 is provided in the base part 3, and the first and second through-holes 31 and 32 communicate with each other, thereby configuring the through-hole 30.

The center axes of the first through-hole 31 and the second through-hole 32 coincide with each other. A tubular insulator 40 is fixed to an inner peripheral surface 32a of the second through-hole 32 with an adhesive 49. The inner diameter of the second through-hole 32 is larger than the inner diameter of the first through-hole 31 by an amount corresponding to a thickness portion by the insulator 40.

An O-ring 50 that is an annular sealing member is sandwiched between a distal end surface 41a of the insulator 40, which is located on the electrostatic chuck part 2 side (that is, the upper side), and the electrostatic chuck part 2. A tubular insulating wall member 43 is provided radially inside the O-ring 50. The insulating wall member 43 is integrally formed on the distal end surface 41a of the insulator 40.

(Insulator)

The insulator 40 is made of, for example, ceramic. The insulator 40 has durability against plasma. The ceramics configuring the insulator 40 can be selected in a predetermined manner. For example, ceramics made of one kind selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC), or composite ceramics which includes two or more kinds can be adopted.

The insulator 40 has a first end portion 41 (an upper end portion) which is located on the electrostatic chuck part 2 side, and a second end portion 42 (a lower end portion) which is located on the side opposite thereto.

The inner diameter of the insulator 40 is substantially equal to the inner diameter of the first through-hole 31. It is preferable that an inner peripheral surface 31a of the first through-hole 31 and an inner peripheral surface 40a of the insulator 40 are continuous without a step. However, in a case where the through-hole 30 is the cooling gas introduction hole 30A, the inner diameter of the insulator 40 may be larger than that of the first through-hole 31.

The adhesive 49 is interposed between an outer peripheral surface 40b of the insulator 40 and the inner peripheral surface 32a of the second through-hole 32 to bond and fix these surfaces to each other. As the adhesive 49, organic resin showing durability with respect to plasma and having flexibility is preferable. It is also preferable that the adhesive 49 is in contact with the adhesion layer 4.

The tubular insulating wall member 43 is integrally formed on the distal end surface 41a (an upper end surface 1) of the insulator 40.

The center axis of the insulating wall member 43 and the center axis of the insulator 40 coincide with each other. The inner diameter of the insulating wall member 43 coincides with the inner diameter of the insulator 40. Further, the outer diameter of the insulating wall member 43 is smaller than the outer diameter of the insulating wall member 43. In this embodiment, an end surface 41b (an upper end surface 2) of the insulating wall member 43 is in contact with the lower surface 2b of the electrostatic chuck part 2. However, the end surface 41b may be separated from the lower surface 2b of the electrostatic chuck part 2.

In the present invention, the distal end surface 41a of the insulator may be a flat surface or a sloped surface, or may be a curved surface having an arched cross section or bulging upward, as shown as an example in a sixth embodiment. The distal end surface 41a may have protrusion portion (a tubular insulating wall member).

(O-Ring (Sealing Member))

The O-ring (sealing member) 50 is sandwiched between the distal end surface 41a of the insulator 40 and the electrostatic chuck part 2. The O-ring 50 blocks plasma from going around to the outer periphery side of the insulator 40, and as a result, erosion of the adhesion layer 4 and the adhesive 49 by the plasma is suppressed. The O-ring 50 is in contact with the distal end surface 41a of the insulator 40 and the lower surface 2b of the electrostatic chuck part 2. Further, the O-ring 50 may be in contact with an outer peripheral surface 43b of the insulating wall member 43 or may be in contact with the inner peripheral surface 32a of the second through-hole 32 of the base part 3 through the adhesive 49.

The O-ring 50 is an annular or tubular sealing member made of a material which is selected in a predetermined manner, for example, an elastic body such as rubber or elastomer resin. The size thereof may also be selected as necessary. In this embodiment, a case where an O-ring having a circular cross section is adopted as the sealing member is exemplified. However, the cross-sectional shape of the O-ring which is used in the present invention is not limited to this shape. The shape of the cross section may be a square or an ellipse. In particular, in a case where the cross-sectional shape of a space in which the sealing member is accommodated is a rectangular shape, as shown in this embodiment, infiltration of plasma may be more effectively suppressed by increasing the contact area by using a packing having a rectangular cross section.

The O-ring 50 is sandwiched between the distal end surface 41a and the lower surface 2b of the electrostatic chuck part 2 and compressed vertically, as shown in the drawing. The O-ring 50 comes into annular contact with the lower surface 2b of the electrostatic chuck part 2 at an upper contact point P1 and comes into annular contact with the distal end surface 41a of the insulator 40 at a lower contact point P2. The O-ring 50 seals the inner diameter side and the outer diameter side of the insulator 40 by the upper contact point P1 and the lower contact point P2.

The thickness (the dimension in an up-down direction) of the O-ring 50 before compression is selected in a predetermined manner. However, it is larger than a height H of the insulating wall member 43. In other words, the height H of the insulating wall member 43 is smaller than the thickness (before compression) of the sealing member. In this way, the end surface 41b of the insulating wall member is brought into contact with the lower surface 2b of the electrostatic chuck part 2, whereby the O-ring 50 can be surely compressed.

It is preferable that the O-ring 50 is compressed such that the thickness after compression is 0.5 times or more and 0.8 times or less with respect to the thickness before compression. In this way, at the upper contact point P1 and the lower contact point P2, the certainty of sealing, that is, the certainty of hermetic seal, between the inner periphery side and the outer periphery side of the insulator 40 can be enhanced by the O-ring 50.

In this embodiment, the end surface 41b of the insulating wall member 43 comes into contact with the lower surface 2b of the electrostatic chuck part 2. For this reason, the height H of the insulating wall member 43 becomes equal to the thickness of the O-ring 50 after compression. Therefore, it is possible to make the compression rate of the O-ring 50 dependent on the processing accuracy of the height H of the insulating wall member 43, and thus it is possible to enhance the reliability of the seal without having to adjust the collapse margin of the O-ring at the time of fixing of the insulator 40.

The O-ring 50 may be compressed in a radial direction or may not be compressed in the radial direction.

In a case where the O-ring 50 is compressed in the radial direction, the O-ring 50 is sandwiched between the outer peripheral surface 43b of the insulating wall member 43 and the inner peripheral surface 32a of the second through-hole 32. In this way, a plasma infiltration path is narrowed, so that the infiltration of plasma can be effectively suppressed.

On the other hand, in a case where the O-ring 50 is not compressed in the radial direction, the O-ring 50 is compressed only from the up-down direction, and therefore, an unreasonable load such as twisting is hard to be applied. Therefore, it is possible to enhance the reliability of the seal by the O-ring 50. It is preferable that a radial distance W1 between the outer peripheral surface of the insulating wall member 43 and the outer peripheral surface of the insulator 40 is set to be 0.8 times or more and 1.2 times or less with respect to the radial width of the O-ring 50 before compression. In this way, it is possible to interpose the O-ring 50 between the distal end surface 41a of the insulator 40 and the electrostatic chuck part 2 without causing unreasonable stress such as twisting.

According to the electrostatic chuck device 1 of this embodiment, by interposing the O-ring 50 between the lower surface 2b of the electrostatic chuck part 2 and the distal end surface 41a of the insulator 40, it is possible to block plasma from going around to the outer periphery side of the insulator 40. With this configuration, erosion of the adhesion layer 4 and the adhesive 49 by plasma can be suppressed, and thus the life of the electrostatic chuck device 1 can be prolonged.

Further, according to this embodiment, exposure of the adhesion layer 4 and the adhesive 49 to plasma is suppressed, and therefore, it is possible to lower a requirement for plasma resistance which is required as the materials of the adhesion layer 4 and the adhesive 49. That is, according to this embodiment, it is not necessary to select the materials of the adhesion layer 4 and the adhesive 49 in consideration of the resistance to plasma, and thus it is possible to enhance the degree of freedom in material selection. As an example, a material having excellent thermal elasticity regardless of the presence or absence of the resistance to plasma is adopted as the adhesion layer 4 and the adhesive 49, whereby a configuration can be made in which a difference in thermal expansion between the electrostatic chuck part 2 and the base part 3 is reduced.

According to the electrostatic chuck device 1 of this embodiment, the insulating wall member 43 for limiting the exposure of the O-ring 50 is provided radially inside the O-ring 50. With this configuration, the area in which the O-ring 50 is exposed to plasma is limited, so that the life of the O-ring 50 can be prolonged.

Further, the insulating wall member 43 suppresses protrusion of the O-ring 50 to the inner periphery side of the insulator 40. That is, the insulating wall member 43 is provided, whereby it is possible to maintain the posture of the O-ring 50 and enhance the certainty of the sealing by the O-ring 50.

Further, the insulating wall member 43 is provided, whereby it is possible to enhance the withstand voltage of the electrostatic chuck device 1. In a case where the end surface 41b of the insulating wall member 43 is in contact with the lower surface 2b of the electrostatic chuck part 2, it is possible to block an electric discharge path and enhance the withstand voltage. Further, even in a case where the end surface 41b of the insulating wall member 43 is not in contact with the lower surface 2b of the electrostatic chuck part 2, it is possible to narrow an electric discharge path by the insulating wall member 43. In this way, it is possible to enhance the withstand voltage of the electrostatic chuck device 1 by lengthening a path for electric discharge.

In the electrostatic chuck device 1 of this embodiment, the insulator 40 is fixed by curing the adhesive 49 in a state of bringing the end surface 41b of the insulating wall member 43 into contact with the lower surface 2b of the electrostatic chuck part 2 and compressing the O-ring 50 between the distal end surface 41a of the insulator 40 and the lower surface 2b of the electrostatic chuck part 2. Further, in a case where the end surface 41b is separated from the lower surface 2b of the electrostatic chuck part 2, the insulator 40 is fixed by curing the adhesive 49 while adjusting the collapse margin of the O-ring 50 on the distal end surface 41a with a dial gauge or the like.

The electrostatic chuck device 1 of the first embodiment may have a heater element 9, as shown by a two-dot chain line in FIG. 2. The heater element 9 is fixed to the lower surface 2b of the electrostatic chuck part 2 through an adhesive (not shown). Further, the heater element 9 is embedded in the adhesion layer 4 between the lower surface 2b of the electrostatic chuck part 2 and the upper surface 3a of the base part 3. The heater element 9 can be formed in a shape which is selected in a predetermined manner, or of a material which is selected in a predetermined manner, and in this example, it is configured with a conductive member in which a band-shaped metal material having a narrow width meanders. The heater element 9 may control the temperature of the electrostatic chuck part 2 by connecting the power supply terminal to both ends of the heater element 9 and generating heat by making an electric current flow through the heater element 9.

Modification Example 1

Figure 3:
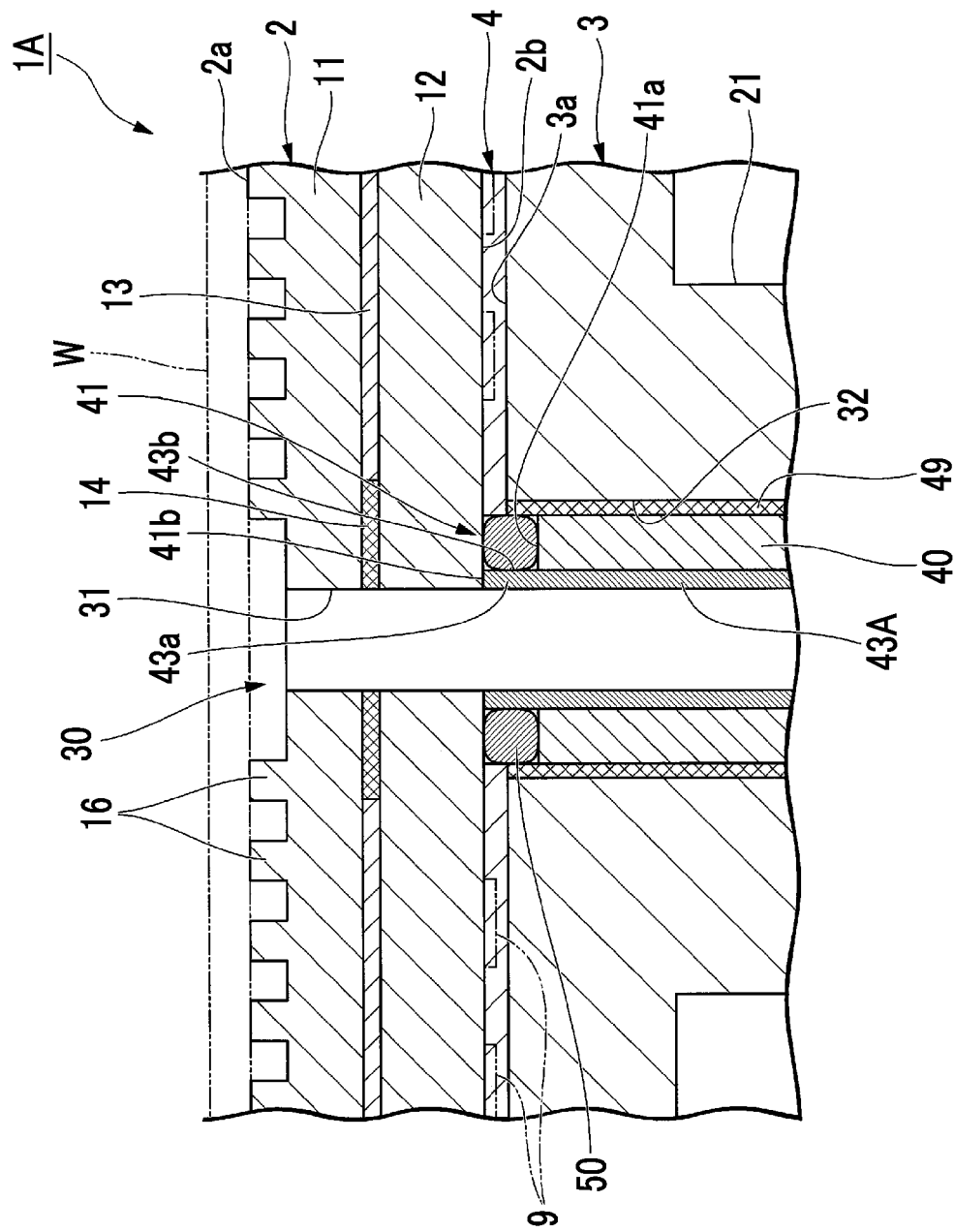
FIG. 3 is an enlarged sectional view of an electrostatic chuck device of Modification Example 1 of the first embodiment.

FIG. 3 is an enlarged sectional view of an electrostatic chuck device 1A of Modification Example 1 of the first embodiment. Constituent elements of the same aspect as the embodiment described above are denoted by the same reference numerals, and description thereof is omitted. The electrostatic chuck device 1A of this modification example is different from the electrostatic chuck device 1 of the first embodiment in that an insulator 40A and an insulating wall member 43A are separate members and the insulating wall member 43A is nested inside the insulator 40A.

The insulating wall member 43A has a cylindrical shape. (At least a part of) the insulating wall member 43A is located radially inside the insulator 40A. The insulating wall member 43A is bonded and fixed to the inner peripheral surface of the insulator 40A. The outer diameter of the insulating wall member 43A is slightly smaller than the inner diameter of the insulator 40A. The insulating wall member 43A is slightly longer than the insulator 40A. An upper end portion 43a of the insulating wall member 43A protrudes further upward than the distal end surface 41a of the insulator 40A. The upper end portion 43a is located radially inside.

According to the electrostatic chuck device 1A of this modification example, the insulator 40A and the insulating wall member 43A are separate members. For this reason, the insulator 40A and the insulating wall member 43A can be made of different materials. As an example, by using a material having high plasma resistance (for example, ceramics) for the insulating wall member 43A and using a material having low thermal conductivity (for example, resin) for the insulator 40A, it is possible to enhance the plasma resistance and reduce heat discharge from the periphery of the through-hole 30 to the base part 3.

In this modification example, the insulating wall member 43A is bonded and fixed to the insulator 40A. However, other configurations may be adopted. For example, the insulating wall member 43A may be fixed by providing a protrusion portion which extends inward in the radial direction at the lower end of the insulator 40A and sandwiching the insulating wall member 43A between the protrusion portion and the lower surface 2b of the electrostatic chuck part 2 in the up-down direction. Further, in a case where the insulating wall member 43A is made of ceramics and the insulator 40A is made of a resin member, the insulating wall member 43A and the insulator 40A may be fixedly formed by integral molding. Further, the insulating wall member 43A and the insulator 40A may be fixed to each other by forming the insulator 40A from heat shrinkable resin material and bringing it into contact with the insulating wall member 43A and heating them.

Modification Example 2

Figure 4:
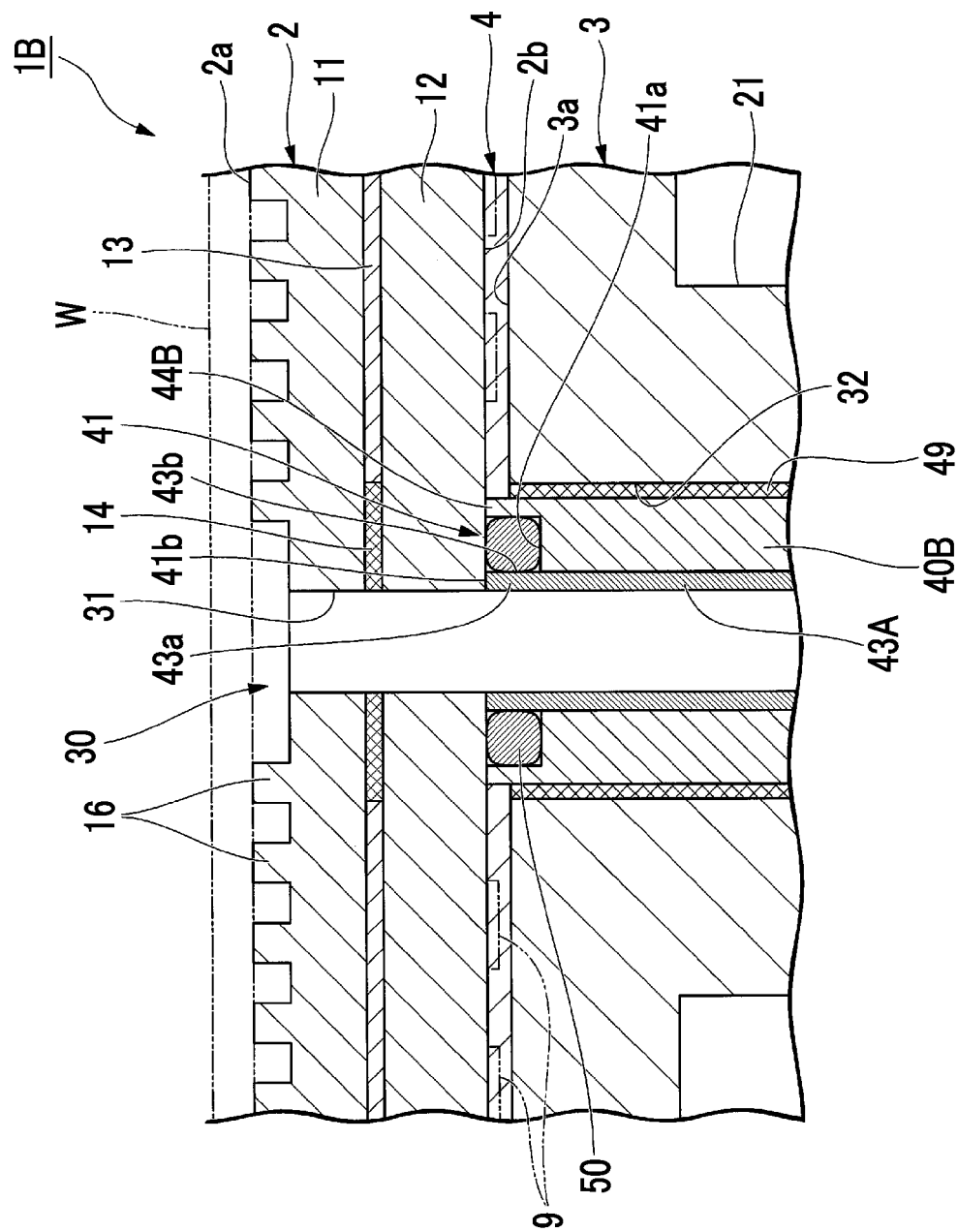
FIG. 4 is an enlarged sectional view of an electrostatic chuck device of Modification Example 2 of the first embodiment.

FIG. 4 is an enlarged sectional view of an electrostatic chuck device 1B of Modification Example 2 of the first embodiment. Constituent elements of the same aspect as the embodiment described above and Modification Example 1 are denoted by the same reference numerals, and description thereof is omitted. The electrostatic chuck device 1B of this modification example is different from the electrostatic chuck device 1A of Modification Example 1 in that a tubular outer insulating wall (outer insulating wall member) 44B is integrally formed on the distal end surface 41a of an insulator 40B. That is, according to this modification example, the tubular outer insulating wall 44, which is a part of the insulator 40B, is located radially outside the O-ring 50.

According to the electrostatic chuck device 1B of this modification example, the upper end portion 43a of the insulating wall member 43A is located radially inside the O-ring 50 and the outer insulating wall 44 is provided radially outside the O-ring 50. In this way, in the electrostatic chuck device 1B, an electric discharge path, that is, a plasma infiltration path is further increased, and thus the withstand voltage can be enhanced.

Second Embodiment

Figure 5:
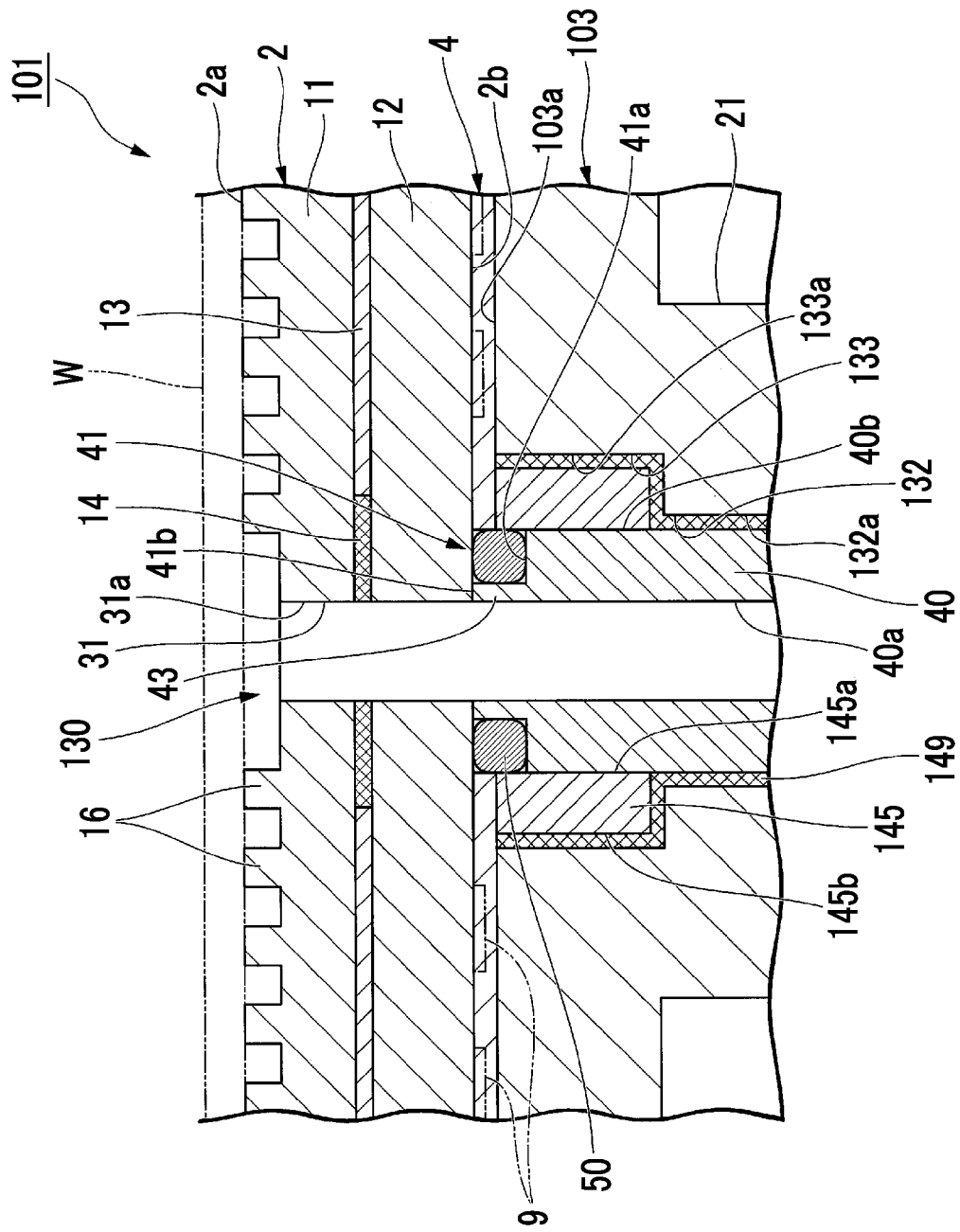
FIG. 5 is an enlarged sectional view of an electrostatic chuck device of a second embodiment.

FIG. 5 is an enlarged sectional view of an electrostatic chuck device 101 of a second embodiment. The electrostatic chuck device 101 of the second embodiment is different from the electrostatic chuck device 1 of the first embodiment in that the electrostatic chuck device 101 has an insulating ring 145 surrounding the first end portion 41 of the insulator 40 from the outside in the radial direction.

Constituent elements of the same aspect as the embodiment described above are denoted by the same reference numerals, and description thereof is omitted.

The electrostatic chuck device 101 is provided with the electrostatic chuck part 2, a base part 103, and the adhesion layer 4. Further, in the electrostatic chuck device 101, in the electrostatic chuck part 2, the base part 103, and the adhesion layer 4, a plurality of through-holes 130 vertically penetrating them are provided. The through-holes 130 are used for cooling gas introduction or lift pin insertion. Each of the through-holes 130 has the first through-hole 31 which is a portion penetrating the electrostatic chuck part 2, and a second through-hole 132 which is a portion penetrating the base part 103.

The insulator 40 is fixed to an inner peripheral surface 132a of the second through-hole 132 by an adhesive 149. A counterbore 133 is provided in an opening of the second through-hole 132, which is located on the electrostatic chuck part 2 side (the upper side). The counterbore 133 has a larger diameter than the second through-hole 132 and has a concentric circular shape. The insulating ring 145 is fixed to an inner peripheral surface 133a of the counterbore 133.

The insulating ring 145 is made of an insulating member formed in an annular shape. The insulating ring 145 can be formed of a material which is selected in a predetermined manner, and may be made of the same material (for example, ceramics) as the insulator 40 or may be made of a different material (for example, a resin material) from the insulator 40. The outer diameter of the insulating ring 145 is slightly smaller than the inner diameter of the counterbore 133. The adhesive 149 is interposed between an outer peripheral surface 145b of the insulating ring 145 and the inner peripheral surface 133a of the counterbore 133 to bond and fix them to each other.

The inner diameter of the insulating ring 145 is slightly smaller than the inner diameter of the second through-hole 132 and is substantially the same as the outer diameter of the insulator 40. An inner peripheral surface 145a of the insulating ring 145 is in contact with the outer peripheral surface 40b of the insulator 40. The insulating ring 145 surrounds the first end portion 41 of the insulator 40 from the outside in the radial direction.

The insulating wall member 43 having an outer diameter smaller than that of the insulator 40 is integrally formed on the distal end surface 41a of the insulator 40, similar to the first embodiment. The O-ring 50 is sandwiched between the distal end surface 41a of the insulator 40 and the lower surface 2b of the electrostatic chuck part 2. The insulating wall member 43 is located radially inside the O-ring 50. The end surface 41b of the insulating wall member 43 is in contact with the lower surface 2b of the electrostatic chuck part 2.

According to the electrostatic chuck device 101 of this embodiment, the electrostatic chuck device 101 has a double insulation structure composed of the insulator 40 and the insulating ring 145. In this way, the withstand voltage of the electrostatic chuck device 101 can be enhanced.

The electrostatic chuck device 101 of the second embodiment may have the heater element 9, similar to the first embodiment. In general, cooling from the base part 103 is not performed in the vicinity of the through-hole 130, and therefore, the temperature of the electrostatic chuck part 2 tends to become high. According to the electrostatic chuck device 101 of this embodiment, the inner surface of the through-hole 130 is protected in an adiabatic state by the double structure of the insulator 40 and the insulating ring 145. In this way, it is become difficult to be affected by the heat generated by the heater element 9 in the vicinity of the through-hole 130, so that a temperature rise in the vicinity of the through-hole 130 can be suppressed and it is possible to achieve temperature equalization of the electrostatic chuck part 2.

In the electrostatic chuck device 101, it is preferable that the thermal conductivity of the insulating ring 145 depending on a material and a size is set in accordance with the presence or absence of the heater element 9 and the heat generation performance thereof. In a case where the electrostatic chuck device 101 has the heater element 9, it is preferable to reduce the thermal conductivity of the insulating ring 145. In this way, it is possible to enhance the thermal insulation performance of the insulating ring, and thus it is possible to promote the temperature equalization of the electrostatic chuck part 2. On the other hand, in a case where the electrostatic chuck device 101 does not have the heater element 9, it is preferable to increase the thermal conductivity of the insulating ring 145. In this way, it is possible to efficiently release heat from the vicinity of the through-hole 130 where cooling is likely to be insufficient as compared with other regions, and thus it is possible to promote the temperature equalization of the electrostatic chuck part 2.

Third Embodiment

Figure 6:
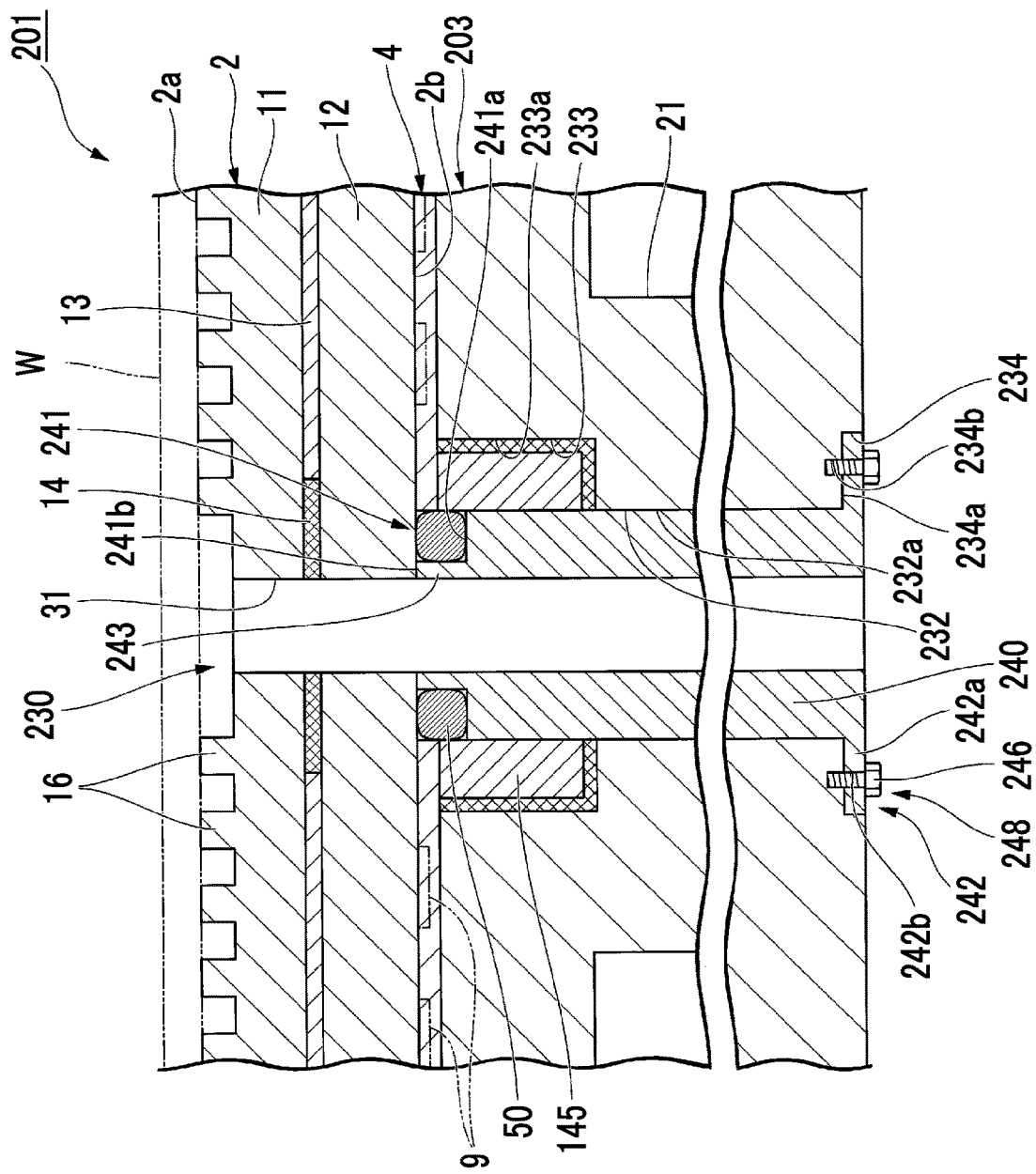
FIG. 6 is an enlarged sectional view of an electrostatic chuck device of a third embodiment.

FIG. 6 is an enlarged sectional view of an electrostatic chuck device 201 of a third embodiment. In the electrostatic chuck device 201 of the third embodiment, a method of fixing an insulator 240 is mainly different from that in the second embodiment. Constituent elements of the same aspect as the embodiments described above are denoted by the same reference numerals, and description thereof is omitted.

The electrostatic chuck device 201 is provided with the electrostatic chuck part 2, a base part 203, and the adhesion layer 4. Further, in the electrostatic chuck device 201, in the electrostatic chuck part 2, the base part 203, and the adhesion layer 4, a plurality of through-holes 230 vertically penetrating them are provided. The through-holes 230 are used for cooling gas introduction or lift pin insertion. Each of the through-holes 230 has the first through-hole 31 which is a portion penetrating the electrostatic chuck part 2, and a second through-hole 232 which is a portion penetrating the base part 203.

An insulator 240 is inserted into an inner peripheral surface 232a of the second through-hole 232. A counterbore 233 is provided in an opening of the second through-hole 232, which is located on the electrostatic chuck part 2 side (the upper side), similar to the second embodiment, and the insulating ring 145 is fixed to an inner peripheral surface 233a of the counterbore 233. Further, a lower counterbore 234 is provided in an opening of the second through-hole 232, which is located on the side (the lower side) opposite to the electrostatic chuck part 2. A fixing surface 234a facing downward is provided in the lower counterbore 234. A screw hole 234b into which a screw 246 for fixing the insulator 240 is inserted is formed in the fixing surface 234a.

The insulator 240 has a first end portion 241 which is located on the electrostatic chuck part 2 side, and a second end portion 242 which is located on the side opposite to the first end portion 241. An insulating wall member 243 having an outer diameter smaller than that of the insulator 240 is integrally formed on the distal end surface 241a of the insulator 240, which is located at the first end portion 241, similar to the first and second embodiments. The O-ring 50 is sandwiched between the distal end surface 241a of the insulator 240 and the lower surface 2b of the electrostatic chuck part 2. The insulating wall member 243 is located radially inside the O-ring 50. An end surface 241b of the insulating wall member 243 is in contact with the lower surface 2b of the electrostatic chuck part 2.

A flange portion 242a extending to the outside in the radial direction is provided in the second end portion 242 of the insulator 240. A through-hole 242b penetrating in the up-down direction is formed in the flange portion 242a. The flange portion 242a is accommodated in the lower counterbore 234. A worker can fix the insulator 240 to the base part 203 by inserting the screw 246 into the through-hole 242b of the flange portion 242a and fastening it to the screw hole 234b of the base part 203. The flange portion 242a and the screw 246 configure a fixing part 248 of the insulator 240. That is, the insulator 240 is detachably fixed to the base part 203 by the fixing part 248.

According to the electrostatic chuck device 201 of this embodiment, the insulator 240 is mechanically fixed to the base part 203 and is detachable. In this way, it is possible to easily replace the O-ring 50 sandwiched between the first end portion 241 of the insulator 240 and the electrostatic chuck part 2. The O-ring 50 is easily eroded by plasma because it seals the space between the insulator 240 and the electrostatic chuck part 2 to prevent plasma infiltration. Due to a configuration in which the O-ring 50 is replaceable, it is possible to further prolong the service life of the electrostatic chuck device 201.

In this embodiment, the insulator 240 is fixed to the base part 203 by the screw 246 at the flange portion 242a. However, the method of fixing the insulator 240 is not limited thereto. For example, the insulator 240 may be fixed by forming a male screw on the outer peripheral surface of the flange portion 242a, forming a female screw on the inner peripheral surface of the lower counterbore 234 of the base part 203, and screwing the male screw and the female screw to each other. In this case, the flange portion 242a and the insulator 240 may be separate bodies.

Various examples of the electrostatic chuck of the first aspect of the present invention have been described above. However, the respective configurations in the respective examples, combinations thereof, and the like are merely examples, and changes can be made within a scope which does not depart from the gist of the invention. Further, in the embodiments described above, the insulator and the insulating wall member are an integral member. However, the insulator and the insulating wall member may be separate members.

Electrostatic Chuck Device of Second Aspect

An electrostatic chuck device of a second aspect is mainly different from the electrostatic chuck device of the first aspect in that the electrostatic chuck device of the second aspect does not have the tubular insulating wall member described in the first aspect, as an indispensable member, and has the insulating ring which is provided in the counterbore provided in the opening of the second through-hole, which is located on the electrostatic chuck part side, as an indispensable member.

Unless there is a problem, the device of the second aspect may have the features which are described in the first or third aspect. The second and third embodiments or the sixth embodiment (described later) may be considered as being included in the electrostatic chuck device of the second aspect in a case where the insulating ring is provided.

Hereinafter, a preferred example of the electrostatic chuck device of the second aspect will be described.

Constituent elements of the same aspect as the first embodiment of the first aspect described above are denoted by the same reference numerals, and description thereof is omitted.

Fourth Embodiment

Figure 7:
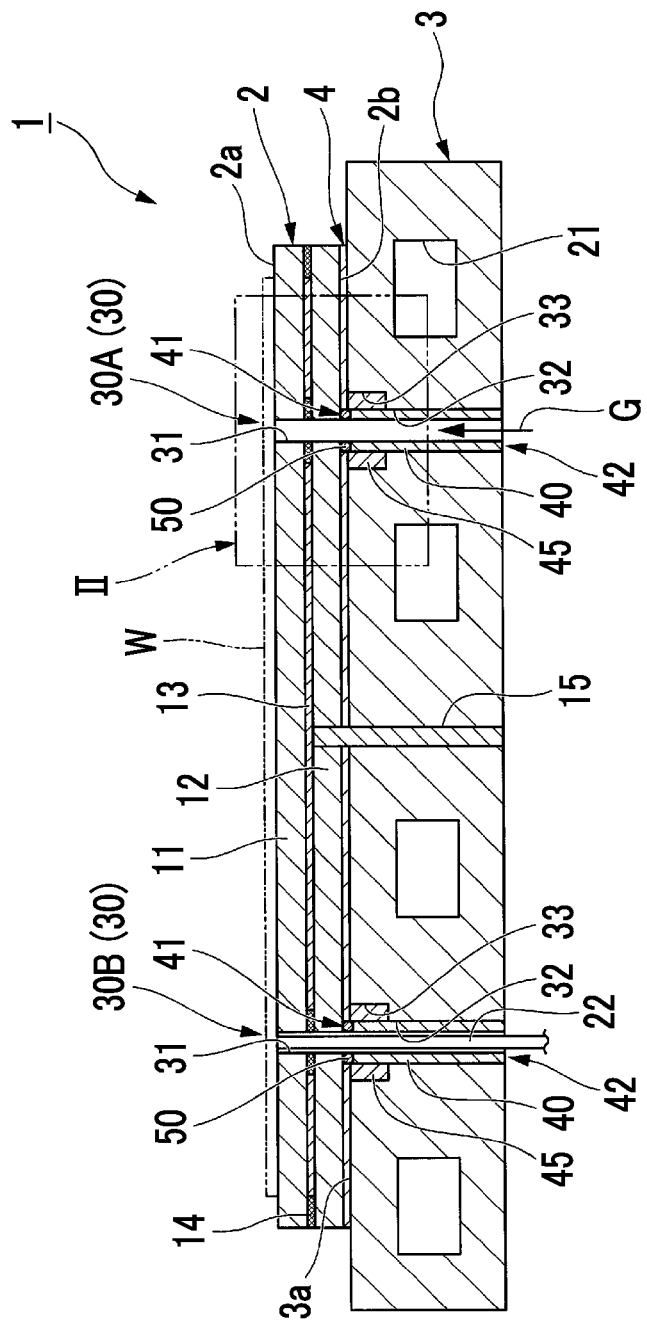
FIG. 7 is a sectional view of an electrostatic chuck device of a fourth embodiment.
Figure 8:
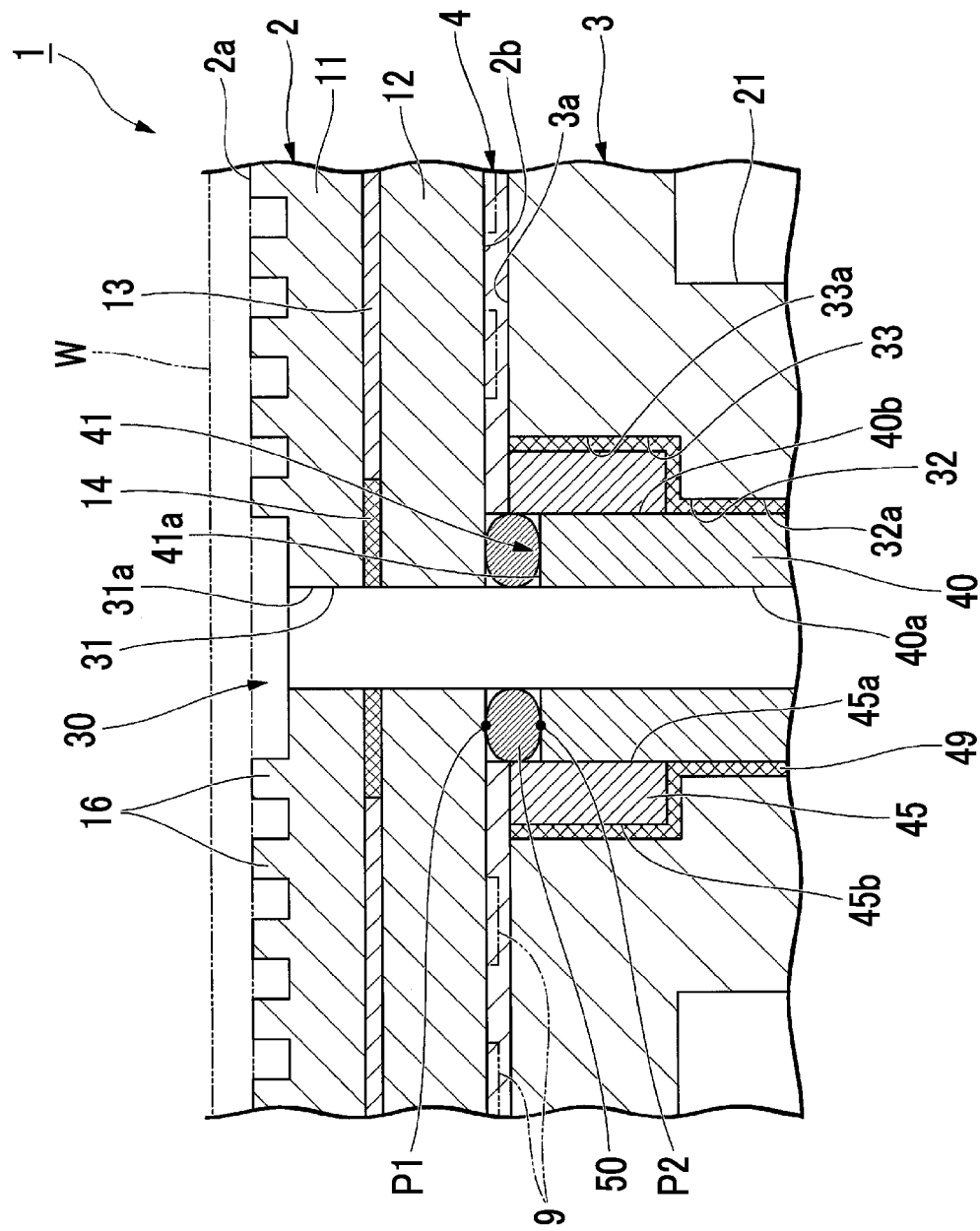
FIG. 8 is an enlarged view of a region II shown in FIG. 7.

FIG. 7 is a sectional view of an electrostatic chuck device 1 of a fourth embodiment. Further, FIG. 8 is an enlarged view of a region II shown in FIG. 7. The electrostatic chuck device 1 includes: an electrostatic chuck part 2 having a placing surface 2a on which the plate-like sample W is placed, and a built-in internal electrode for electrostatic attraction 13; a base part 3 which cools the electrostatic chuck part 2 from below; and an adhesion layer 4 which bonds and integrates the electrostatic chuck part 2 and the base part 3 together.

In the electrostatic chuck device 1, in the electrostatic chuck part 2, the base part 3, and the adhesion layer 4, a plurality of through-holes vertically penetrating them are provided. The through-holes are used for cooling gas introduction or lift pin insertion. Each of the through-holes has the first through-hole 31 which is a portion penetrating the electrostatic chuck part 2, and the second through-hole 32 which is a portion penetrating the base part 3.

(Electrostatic Chuck Part, Base Part, and Adhesion Layer)

The electrostatic chuck part 2 is basically the same as the electrostatic chuck part 2 described in the first embodiment, and therefore, it is denoted by the same reference numeral and description thereof is omitted.

The base part 3 is basically the same as the base part 3 described in the first embodiment except for the points relating to the second through-hole, and therefore, it is denoted by the same reference numeral and description thereof is omitted.

The adhesion layer 4 is basically the same as the adhesion layer 4 described in the first embodiment, and therefore, it is denoted by the same reference numeral and description thereof is omitted.

(Cooling Gas Introduction Hole and Pin Insertion Hole)

As shown in FIG. 7, in the electrostatic chuck part 2, the base part 3, and the adhesion layer 4, a plurality of cooling gas introduction holes 30A and a plurality of pin insertion holes 30B are provided to vertically penetrating them. The cooling gas introduction hole 30A and the pin insertion hole 30B are basically the same as the cooling gas introduction hole 30A and the pin insertion hole 30B described in the first or third embodiment, and with respect to the same places, description thereof is omitted.

As shown in FIG. 8, the tubular insulator 40 is fixed to the inner peripheral surface 32a of the second through-hole 32 with the adhesive 49. The inner diameter of the second through-hole 32 is larger than the inner diameter of the first through-hole 31 by an amount corresponding to the thickness portion of the insulator 40.

The O-ring 50 that is an annular sealing member is sandwiched between the distal end surface 41a of the insulator 40, which is located on the electrostatic chuck part 2 side (that is, the upper side), and the electrostatic chuck part 2.

As shown in FIG. 8, a counterbore 33 is provided in the opening of the second through-hole 32, which is located on the electrostatic chuck part 2 side (the upper side). The counterbore 33 has a larger diameter than the second through-hole 32 and has a concentric circular shape. An insulating ring 45 is fixed to an inner peripheral surface 33a of the counterbore 33.

(Insulator)

The insulator 40 can be formed of the same material as the insulator 40 described in the first embodiment.

The insulator 40 has the first end portion 41 which is located on the electrostatic chuck part 2 side, and the second end portion 42 which is located on the side opposite thereto. The inner diameter of the insulator 40 is substantially equal to the inner diameter of the first through-hole 31. It is preferable that the inner peripheral surface 31a of the first through-hole 31 and the inner peripheral surface 40a of the insulator 40 are continuous without a step. However, in a case where the through-hole 30 is the cooling gas introduction hole 30A, the inner diameter of the insulator 40 may be larger than that of the first through-hole 31.

The adhesive 49 is interposed between the outer peripheral surface 40b of the insulator 40 and the inner peripheral surface 32a of the second through-hole 32 to bond and fix them to each other. As the adhesive 49, organic resin showing durability with respect to plasma and having flexibility is preferable.

(Insulating Ring)

The insulating ring 45 is made of an insulating member formed in an annular shape. The insulating ring 45 may be formed of the same material (for example, ceramics) as the insulator 40 or may be formed of a different material (for example, a resin material) from the insulator 40. The outer diameter of the insulating ring 45 is slightly smaller than the inner diameter of the counterbore 33. The adhesive 49 is interposed between an outer peripheral surface 45b of the insulating ring 45 and the inner peripheral surface 33a of the counterbore 33 to bond and fix them to each other.

The inner diameter of the insulating ring 45 is slightly smaller than the inner diameter of the second through-hole 32 and is substantially the same as the outer diameter of the insulator 40. An inner peripheral surface 45a of the insulating ring 45 is in contact with the outer peripheral surface 40b of the insulator 40. The insulating ring 45 surrounds the first end portion 41 of the insulator 40 from the outside in the radial direction.

(O-Ring (Sealing Member))

As shown in FIG. 8, the O-ring (sealing member) 50 is sandwiched between the distal end surface 41a of the insulator 40 and the electrostatic chuck part 2. The O-ring 50 blocks plasma from going around to the outer periphery side of the insulator 40 and suppresses the erosion of the adhesion layer 4 and the adhesive 49 by the plasma. The O-ring 50 is in contact with the distal end surface 41a of the insulator 40 and the lower surface 2b of the electrostatic chuck part 2.

The O-ring 50 can be formed of an arbitrary material and is a tubular or annular sealing member formed of an elastic body such as rubber or elastomer resin. In this embodiment, a case where an O-ring having a circular cross section is adopted as the sealing member is exemplified. However, the cross-sectional shape of the O-ring is not limited thereto. The cross-sectional shape may be a square or an ellipse. For example, as the sealing member, a packing having a rectangular cross section may be used.

The O-ring 50 is sandwiched between the distal end surface 41a and the lower surface 2b of the electrostatic chuck part 2 and compressed vertically. The O-ring 50 comes into annular contact with the lower surface 2b of the electrostatic chuck part 2 at the upper contact point P1 and comes into annular contact with the distal end surface 41a of the insulator 40 at the lower contact point P2. The O-ring 50 seals the inner diameter side and the outer diameter side of the insulator 40 at the upper contact point P1 and the lower contact point P2.

It is preferable that the O-ring 50 is compressed such that the thickness after compression is 0.5 times or more and 0.8 times or less with respect to the thickness before compression. In this way, at the upper contact point P1 and the lower contact point P2, the certainty of sealing between the inner periphery side and the outer periphery side of the insulator 40 can be enhanced by the O-ring 50.

According to the electrostatic chuck device 1 of this embodiment, by interposing the O-ring 50 between the lower surface 2b of the electrostatic chuck part 2 and the distal end surface 41a of the insulator 40, it is possible to block plasma from going around to the outer periphery side of the insulator 40. In this way, the erosion of the adhesion layer 4 and the adhesive 49 by the plasma can be suppressed, and thus the life of the electrostatic chuck device 1 can be prolonged.

Further, according to this embodiment, exposure of the adhesion layer 4 and the adhesive 49 to plasma is suppressed, and therefore, it is possible to lower a requirement for plasma resistance which is required as the materials of the adhesion layer 4 and the adhesive 49. That is, according to this embodiment, it is not necessary to select the materials of the adhesion layer 4 and the adhesive 49 in consideration of the resistance to plasma, and thus it is possible to enhance the degree of freedom in material selection. As an example, a configuration can be made in which a difference in thermal expansion between the electrostatic chuck part 2 and the base part 3 is reduced by adopting a material having excellent thermal elasticity regardless of the presence or absence of the resistance to plasma as the adhesion layer 4 and the adhesive 49.

According to the electrostatic chuck device 1 of this embodiment, the electrostatic chuck device 1 has a double insulation structure composed of the insulator 40 and the insulating ring 45. The adhesion layer 4 and the adhesive 49 can be protected from plasma by the insulator 40 and the insulating ring 45 of the double insulation structure. In addition, an electric discharge path to the base part 3 can be lengthened by the insulator 40 and the insulating ring 45 of the double insulation structure, and thus it is possible to enhance the withstand voltage of the electrostatic chuck device 1.

In the electrostatic chuck device 1 of this embodiment, the insulator 40 is fixed by curing the adhesive 49 while adjusting a collapsed margin of the O-ring 50 on the distal end surface 41a with a dial gauge or the like.

The electrostatic chuck device 1 of the fourth embodiment may have the heater element 9, as shown by a two-dot chain line in FIG. 8. The heater element 9 can take the configuration as described in the first embodiment.

In general, according to the electrostatic chuck device 1 provided with the heater element 9, since a heater cannot be disposed around the through-hole 30, the temperature in the vicinity of the through-hole 30 tends to be lowered. However, a decrease in the temperature in the vicinity of the through-hole 30 is suppressed by suppressing heat escape to the cooling base by the insulator 40 and the insulating ring 45 of the double-structure, and thus it is possible to achieve the temperature equalization of the electrostatic chuck part 2.

In the electrostatic chuck device 1, it is preferable that the thermal conductivity of the insulating ring 45 depending on a material and a size is set in accordance with the presence or absence of the heater element 9 and the heat generation performance thereof. In a case where the electrostatic chuck device 1 has the heater element 9, it is preferable to reduce the thermal conductivity of the insulating ring 45. In this way, it is possible to enhance the thermal insulation performance of the insulating ring, and thus it is possible to promote the temperature equalization of the electrostatic chuck part 2. On the other hand, in a case where the electrostatic chuck device 1 does not have the heater element 9, it is preferable to increase the thermal conductivity of the insulating ring 45. In this way, it is possible to efficiently release heat from the vicinity of the through-hole 30 where cooling is likely to be insufficient as compared with other regions, and thus it is possible to promote the temperature equalization of the electrostatic chuck part 2.

Fifth Embodiment

Figure 9:
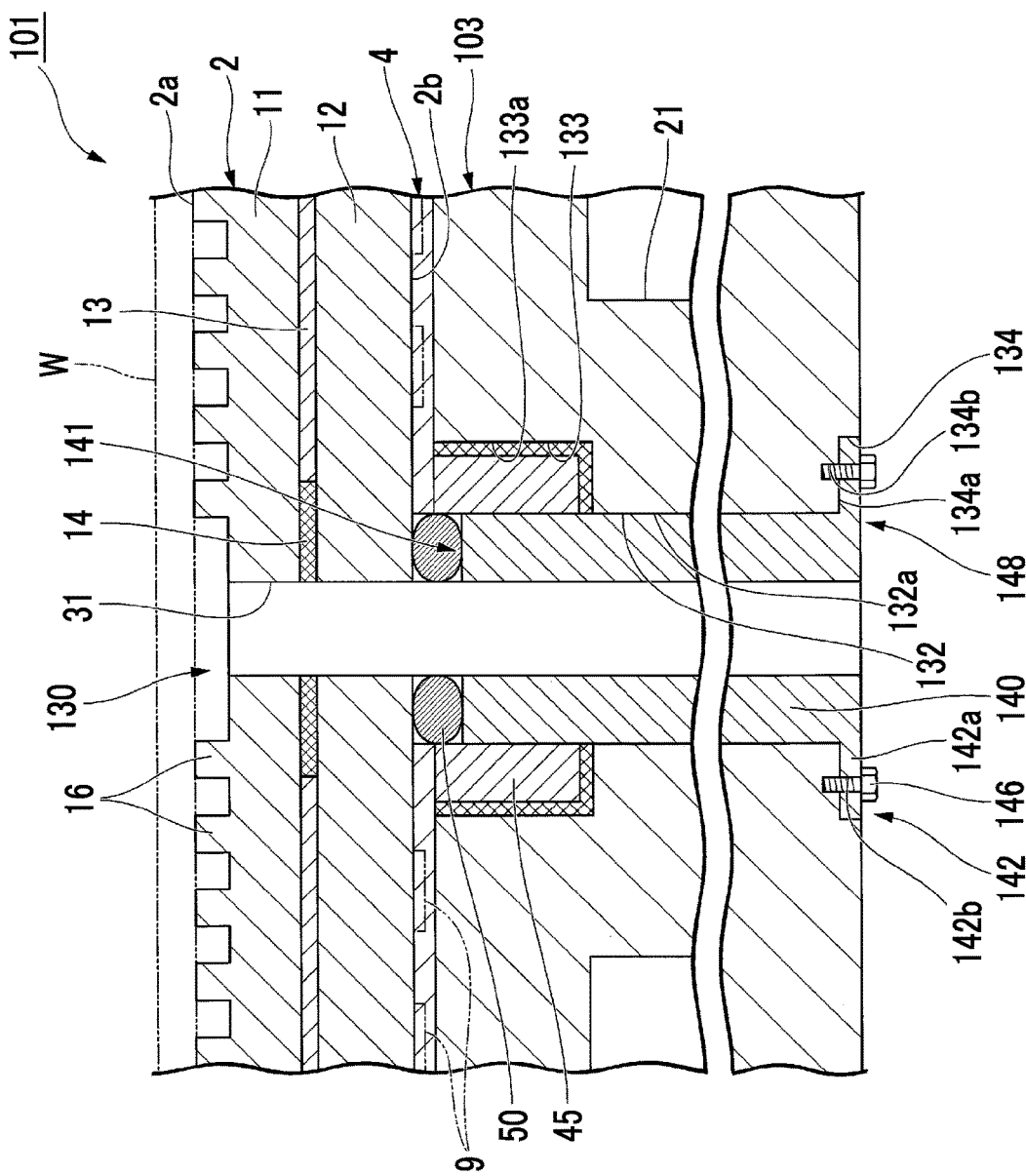
FIG. 9 is an enlarged sectional view of an electrostatic chuck device of a fifth embodiment.

FIG. 9 is an enlarged sectional view of an electrostatic chuck device 101 of a fifth embodiment. In the electrostatic chuck device 101 of the fifth embodiment, a method of fixing an insulator 140 is mainly different from that in the fourth embodiment. Constituent elements of the same aspect as the embodiments described above are denoted by the same reference numerals, and description thereof is omitted. The fifth embodiment is also similar to the third embodiment. However, the fifth embodiment is different from the third embodiment in that there is no tubular insulating wall member.

The electrostatic chuck device 101 is provided with the electrostatic chuck part 2, the base part 103, and the adhesion layer 4. Further, in the electrostatic chuck device 101, in the electrostatic chuck part 2, the base part 103, and the adhesion layer 4, the plurality of through-holes 130 vertically penetrating them are provided. The through-holes 130 are used for cooling gas introduction or lift pin insertion. Each of the through-holes 130 has the first through-hole 31 which is a portion penetrating the electrostatic chuck part 2, and a second through-hole 132 which is a portion penetrating the base part 103.

An insulator 140 is inserted into an inner peripheral surface 132*a* of the second through-hole 132. The counterbore 133 is provided in an opening of the second through-hole 132, which is located on the electrostatic chuck part 2 side (the upper side), similar to the fourth embodiment, and the insulating ring 45 is fixed to the inner peripheral surface 133*a* of the counterbore 133. Further, a lower counterbore 134 is provided in an opening of the second through-hole 132 on the side (the lower side) opposite to the electrostatic chuck part 2. A fixing surface 134*a* facing downward is provided in the lower counterbore 134. A screw hole 134*b* into which a screw 146 for fixing the insulator 140 is inserted is formed in the fixing surface 134*a*.

The insulator 140 has a first end portion 141 which is located on the electrostatic chuck part 2 side, and a second end portion 142 which is located on the side opposite to the first end portion 141. The O-ring 50 is sandwiched between a distal end surface 141*a* of the insulator 140 and the lower surface 2*b* of the electrostatic chuck part 2.

A flange portion 142*a* extending radially outside is provided in the second end portion 142 of the insulator 140. A through-hole 142*b* penetrating in the up-down direction is formed in the flange portion 142*a*. The flange portion 142*a* is accommodated in the lower counterbore 134. A worker can fix the insulator 140 to the base part 103 by inserting the screw 246 into the through-hole 142*b* of the flange portion 142*a* and fastening it to the screw hole 134*b* of the base part 103. The flange portion 142*a* and the screw 146 configure a fixing part 148 of the insulator 140. That is, the insulator 140 is detachably fixed to the base part 103 by the fixing part 148.

According to the electrostatic chuck device 101 of this embodiment, the insulator 140 is mechanically fixed to the base part 103 and is detachable. In this way, it is possible to easily replace the O-ring 50 sandwiched between the first end portion 141 of the insulator 140 and the electrostatic chuck part 2. The O-ring 50 is easily eroded by plasma because it seals the space between the insulator 140 and the electrostatic chuck part 2 to prevent plasma infiltration. Due to a configuration in which the O-ring 50 is replaceable, it is possible to further prolong the service life of the electrostatic chuck device 101.

In this embodiment, the insulator 140 is fixed to the base part 103 by the screw 146 at the flange portion 142*a*. However, the method of fixing the insulator 140 is not limited thereto. For example, the insulator 140 may be fixed by forming a male screw on the outer peripheral surface of the flange portion 142*a*, forming a female screw on the inner peripheral surface of the lower counterbore 134 of the base part 103, and screwing the male screw and the female screw to each other. In this case, the flange portion 142*a* and the insulator 140 may be separate bodies.

Electrostatic Chuck Device of Third Aspect

Sixth Embodiment

Figure 10:
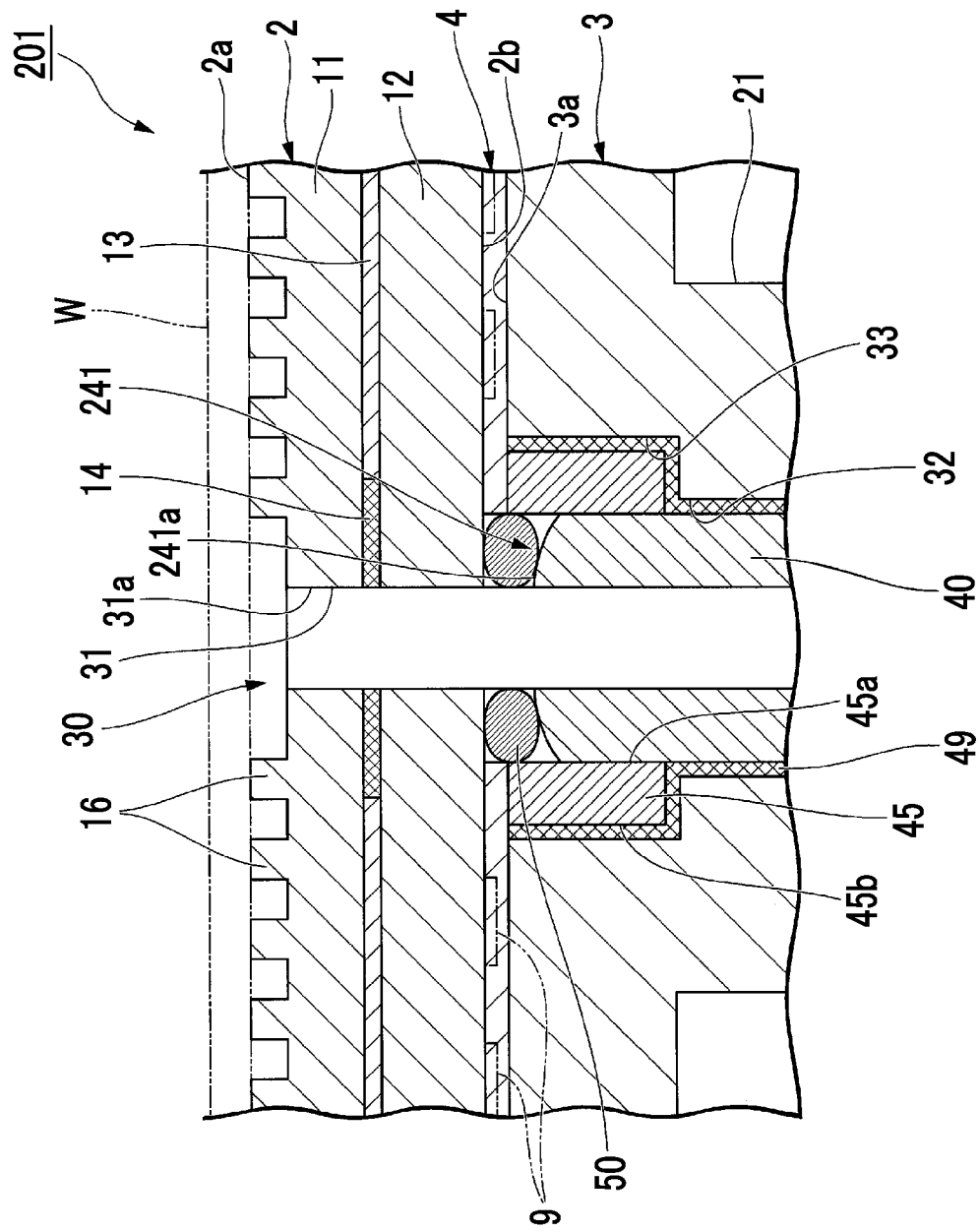
FIG. 10 is an enlarged sectional view of an electrostatic chuck device of a sixth embodiment.

FIG. 10 is an enlarged sectional view of an electrostatic chuck device 201 of a sixth embodiment. In the electrostatic chuck device 201 of the sixth embodiment, the configuration of an insulator 240 is mainly different from that in the fourth embodiment or the second embodiment. Constituent elements of the same aspect as the embodiments described above are denoted by the same reference numerals, and description thereof is omitted. Unless there is a problem, the device of the third aspect may have the features described in the first or second aspect.

The O-ring 50 that is an annular sealing member is sandwiched between the distal end surface 241*a* of the insulator 240, which is located on the electrostatic chuck part 2 side (that is, the upper side), and the electrostatic chuck part 2. The distal end surface 241*a* of the insulator 240 is inclined downward from the inner side in the radial direction toward the outer side in the radial direction. Therefore, the inner diameter side of the distal end surface 241*a* of the insulator 240 is higher than the outer diameter side.

The shape of the distal end surface 241*a* can be selected in a predetermined manner as long as the inner diameter side of the distal end surface 241*a* is higher than the outer diameter side. The inner diameter side or the outer diameter side may be understood as an inner diameter side end portion or an outer diameter side end portion. For example, the distal end surface 241*a* is a curved surface protruding upward and may be a surface in which a radially inner end portion is at a higher position than a radially outer end portion. The distal end surface 241*a* may be a surface having a cross section of an arc or a circular arc shape, in which a radially inner end portion is at a higher position than a radially outer end portion. The distal end surface 241*a* may be a flat surface having an inclination (an inclined surface), in which an inner diameter side end portion is at a higher position than an outer diameter side end portion. In the first embodiment, in a case where the insulating wall member is integrally formed on the distal end surface of the insulator, since the inner diameter side of the distal end surface 241*a* is higher than the outer diameter side, it can be included in the range of the distal end surface of the insulator of the electrostatic chuck device of the third aspect.

According to the electrostatic chuck device 201 of this embodiment, the distal end surface of the insulator 40 has a structure in which the inner diameter side is at a higher position than the outer diameter side, whereby the compressed O-ring 50 is pushed toward the outer periphery side of the insulator 240. Thus, protrusion of the compressed O-ring 50 to the through-hole 30 can be suppressed. That is, it is possible to maintain the posture of the O-ring 50 and enhance the certainty of the sealing by the O-ring 50.

In this embodiment, the electrostatic chuck device 201 is provided with the insulating ring 45 that surrounds the end portion of the insulator 240, which is located on the electrostatic chuck part 2 side, from the outside in the radial direction. However, the above-described effect by a configuration in which the inner diameter side of the distal end surface 241*a* is higher than the outer diameter side can be exhibited regardless of the presence or absence of the insulating ring 45.

Various embodiments of the present invention have been described above. However, the configurations and combinations thereof in the respective embodiments are merely examples, and additions, omissions, substitutions, and other changes of configurations can be made within a scope which does not depart from the gist of the present invention. Further, the present invention is not limited by the embodiments.

For example, in the embodiments described above, the electrostatic chuck device has been described with an example in which the electrostatic chuck device is provided with the heater element 9 embedded in the adhesion layer 4 between the electrostatic chuck part and the base part. However, the heater element may be located in the interior of the electrostatic chuck part or the interior of the base part.

INDUSTRIAL APPLICABILITY

A highly reliable electrostatic chuck device in which it is possible to realize longer life by suppressing the erosion of the adhesion layer by plasma can be provided.

REFERENCE SIGNS LIST 1, 1A, 1B, 101, 201: electrostatic chuck device
2: electrostatic chuck part
2a: placing surface
2b: lower surface of electrostatic chuck part
3, 103, 203: base part
3a, 103a: upper surface of base part
4: adhesion layer
9: heater element
11: placing plate
12: supporting plate
13: internal electrode for electrostatic attraction
14: insulating material layer
15: power supply terminal
16: projection portion
21: flow path
22: lift pin
30, 130, 142b, 230, 242b: through-hole
30A: cooling gas introduction hole
30B: pin insertion hole
31: first through-hole
31a, 32a, 33a, 40a, 45a, 132a, 133a, 145a, 232a, 132a, 233a: inner peripheral surface
32, 132, 232: second through-hole
33, 133, 233: counterbore
40, 40A, 40B, 140, 240: insulator
40a: inner peripheral surface of insulator
40b: outer peripheral surface of insulator
41, 141, 241: first end portion
41a, 141a, 241a: distal end surface
41b, 241b: end surface
42, 242: second end portion
43, 43A, 243: insulating wall member
43a: upper end portion of insulating wall member
43b: outer peripheral surface of insulating wall member
44B: outer insulating wall (outer insulating wall member)
45, 145: insulating ring
49: adhesive
50: O-ring (sealing member)
45a, 145a: inner peripheral surface of insulating ring
45b, 145b: outer peripheral surface of insulating ring
134, 234: lower counterbore
134a, 234a: fixing surface
134b, 234b: screw hole
142: second end portion
142a, 242a: flange portion
142b: through-hole
146, 246: screw
148, 248: fixing part of insulator
148: fixing part
G: cooling gas
P1: upper contact point
P2: lower contact point
W: plate-like sample

The invention claimed is:

1. An electrostatic chuck device comprising:
an electrostatic chuck part which incorporates an internal electrode for electrostatic attraction and has a placing surface on which a plate-like sample is placed;
a base part which cools the electrostatic chuck part; and
an adhesion layer which bonds the electrostatic chuck part and the base part to integrate the parts together,
wherein a first through-hole is provided in the electrostatic chuck part,
a second through-hole that communicates with the first through-hole is provided in the base part,
a tubular insulator is fixed in the second through-hole,
an annular sealing member is sandwiched between the electrostatic chuck part and a distal end surface of the tubular insulator, wherein the distal end surface is located on the electrostatic chuck part side of the tubular insulator, and
a tubular insulating wall member is located at the inner side of the annular sealing member in the radial direction.

2. The electrostatic chuck device according to claim 1, wherein the insulating wall member is integrally formed on the distal end surface of the tubular insulator.

3. The electrostatic chuck device according to claim 1, wherein the insulating wall member is a separate member from the tubular insulator, and at least a part of the insulating wall member is located at the inner side of the tubular insulator in the radial direction.

4. The electrostatic chuck device according to claim 1, wherein a tubular outer insulating wall member is located outside of the annular sealing member in the radial direction.

5. The electrostatic chuck device according to claim 1, wherein a height of the insulating wall member is smaller than a thickness of the annular sealing member.

6. The electrostatic chuck device according to claim 1, wherein the insulating wall member is in contact with the electrostatic chuck part at an end surface of the member on the electrostatic chuck part side.

7. The electrostatic chuck device according to claim 1, wherein
a counterbore is provided at an opening of the second through-hole, wherein the opening is located on the electrostatic chuck part side, an insulating ring is fixed to an inner peripheral surface of the counterbore, and the insulating ring surrounds, from the outside in a radial direction, an end portion of the tubular insulator which is located on the electrostatic chuck part side.

8. The electrostatic chuck device according to claim 1, wherein the tubular insulator has a fixing part by which the tubular insulator is detachably fixed to the base part.

9. The electrostatic chuck device according to claim 1, further comprising:
a heater, which is located at any one of; an interior of the electrostatic chuck part, an interior of the base part, and a position between the electrostatic chuck part and the base part.

10. An electrostatic chuck device comprising:
an electrostatic chuck part which incorporates an internal electrode for electrostatic attraction and has a placing surface on which a plate-like sample is placed;
a base part which cools the electrostatic chuck part; and
an adhesion layer which bonds the electrostatic chuck part and the base part to integrate the parts together,
wherein
a first through-hole is provided in the electrostatic chuck part,
a second through-hole that communicates with the first through-hole is provided in the base part,
a tubular insulator is fixed into the second through-hole,
an annular sealing member is sandwiched between the electrostatic chuck part and a distal end surface of the tubular insulator, wherein the distal end surface is located on the electrostatic chuck part side of the tubular insulator,
a counterbore is provided at an opening of the second through-hole, wherein the opening is located on the electrostatic chuck part side, and
an insulating ring is fixed to an inner peripheral surface of the counterbore, wherein the insulating ring surrounds, from the outside in a radial direction, an end portion of the tubular insulator which is located on the electrostatic chuck part side.

11. The electrostatic chuck device according to claim 10, wherein the tubular insulator has a fixing part at which the tubular insulator is detachably fixed to the base part.

12. The electrostatic chuck device according to claim 10, further comprising:
a heater, which is located at any one of: an interior of the electrostatic chuck part, an interior of the base part, and a space between the electrostatic chuck part and the base part.

13. The electrostatic chuck device according to claim 10, wherein the distal end surface of the tubular insulator, which is located on the electrostatic chuck part side of the tubular insulator, has an inner diameter side and an outer diameter side wherein the inner diameter side is higher than the outer diameter side.

14. The electrostatic chuck device according to claim 10, wherein a tubular insulating wall member is located at the inner side of the annular sealing member in the radial direction.

15. An electrostatic chuck device comprising:
an electrostatic chuck part which incorporates an internal electrode for electrostatic attraction and has a placing surface on which a plate-like sample is placed;
a base part which cools the electrostatic chuck part; and
an adhesion layer which bonds the electrostatic chuck part and the base part to integrate the parts together,
wherein
a first through-hole is provided in the electrostatic chuck part,
a second through-hole that communicates with the first through-hole is provided in the base part,
a tubular insulator is fixed in the second through-hole,
an annular sealing member is sandwiched between the electrostatic chuck part and a distal end surface of the tubular insulator, wherein the distal end surface is located on the electrostatic chuck part side of the tubular insulator, and
the distal end surface of the tubular insulator, which is located on the electrostatic chuck part side, has an inner diameter side and an outer diameter side wherein the inner diameter side is higher than the outer diameter side.

16. The electrostatic chuck device according to claim 15, wherein the tubular insulator has a fixing part by which the tubular insulator is detachably fixed to the base part.

17. The electrostatic chuck device according to claim 15, wherein
a counterbore is provided at an opening of the second through-hole, wherein the opening is located on the electrostatic chuck part side,
an insulating ring is fixed to an inner peripheral surface of the counterbore, and the insulating ring surrounds, from the outside in a radial direction, an end portion of the tubular insulator which is located on the electrostatic chuck part side.

* * * * *